United States Patent
Neikirk et al.

(10) Patent No.: US 10,794,853 B2
(45) Date of Patent: Oct. 6, 2020

(54) METHODS FOR DEPOSITING POLYMER LAYER FOR SENSOR APPLICATIONS VIA HOT WIRE CHEMICAL VAPOR DEPOSITION

(71) Applicant: APPLIED MATERIALS, INC., Santa Clara, CA (US)

(72) Inventors: Colin Neikirk, Sunnyvale, CA (US); Yuriy Melnik, Santa Clara, CA (US); Pravin K. Narwankar, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/833,552

(22) Filed: Dec. 6, 2017

(65) Prior Publication Data
US 2018/0164245 A1 Jun. 14, 2018

Related U.S. Application Data

(60) Provisional application No. 62/432,357, filed on Dec. 9, 2016.

(51) Int. Cl.
*G01N 27/414* (2006.01)
*C23C 16/46* (2006.01)
(Continued)

(52) U.S. Cl.
CPC ....... *G01N 27/414* (2013.01); *C23C 16/4481* (2013.01); *C23C 16/46* (2013.01);
(Continued)

(58) Field of Classification Search
CPC .............. H01L 21/02118; H01L 21/205; H01L 21/02271; H01L 23/293; H01L 21/02277;
(Continued)

(56) References Cited

U.S. PATENT DOCUMENTS

| 4,735,702 A | 4/1988 | Reinhoudt et al. |
| 6,800,802 B2 * | 10/2004 | Chou ............... H01L 27/142 136/244 |

(Continued)

FOREIGN PATENT DOCUMENTS

| JP | 2004-197209 | * | 7/2004 | ........... H01L 21/205 |
| WO | WO 2012/165944 A1 | | 12/2012 | |

(Continued)

OTHER PUBLICATIONS

Alf et al., "Chemical Vapor Deposition of Conformal, Functional, and Responsive Polymer Films", Advanced Materials, 2010, 22, pp. 1993-2027.*

(Continued)

*Primary Examiner* — Mary A Wilczewski
(74) *Attorney, Agent, or Firm* — Moser Taboada

(57) ABSTRACT

The present disclosure relates to a method of depositing a polymer layer, including: providing a substrate, having a sensor structure disposed on the substrate, to a substrate support within a hot wire chemical vapor deposition (HW-CVD) chamber; providing a process gas comprising an initiator gas and a monomer gas and a carrier gas to the HWCVD chamber; heating a plurality of filaments disposed in the HWCVD chamber to a first temperature sufficient to activate the initiator gas without decomposing the monomer gas; and exposing the substrate to initiator radicals from the activated initiator gas and to the monomer gas to deposit a polymer layer atop the sensor structure.

18 Claims, 3 Drawing Sheets

(51) Int. Cl.
*C23C 16/52* (2006.01)
*H01L 23/29* (2006.01)
*H01L 21/56* (2006.01)
*H01L 21/285* (2006.01)
*H01L 21/312* (2006.01)
*H01L 21/47* (2006.01)
*H01L 21/02* (2006.01)
*C23C 16/448* (2006.01)

(52) U.S. Cl.
CPC ............ *C23C 16/463* (2013.01); *C23C 16/52* (2013.01); *H01L 21/02118* (2013.01); *H01L 21/02271* (2013.01); *H01L 21/02277* (2013.01); *H01L 21/02304* (2013.01); *H01L 23/293* (2013.01)

(58) Field of Classification Search
CPC . H01L 21/02304; G01N 27/414; C23C 16/46; C23C 16/463; C23C 16/448; C23C 16/452; C23C 16/4481; C23C 16/52
See application file for complete search history.

(56) References Cited

U.S. PATENT DOCUMENTS

| | | | |
|---|---|---|---|
| 7,452,961 B2 | 11/2008 | Ueda et al. | |
| 8,017,721 B2 | 9/2011 | Ueda et al. | |
| 8,117,987 B2 | 2/2012 | Haas et al. | |
| 8,642,376 B2 | 2/2014 | Chatterjee | |
| 8,662,941 B2 | 3/2014 | Narwankar et al. | |
| 8,709,537 B2 | 4/2014 | Thakur et al. | |
| 8,785,304 B2 | 7/2014 | Chatterjee | |
| 8,906,454 B2 | 12/2014 | Chatterjee et al. | |
| 9,073,040 B2 | 7/2015 | Dobrawa et al. | |
| 9,305,796 B2 | 4/2016 | Chatterjee et al. | |
| 9,416,450 B2 | 8/2016 | Nguyen et al. | |
| 9,673,042 B2 | 6/2017 | Visser et al. | |
| 9,777,094 B2 | 10/2017 | Bittner et al. | |
| 2004/0089337 A1* | 5/2004 | Chou | H01L 27/142 136/244 |
| 2006/0284166 A1 | 12/2006 | Chua et al. | |
| 2007/0032620 A1 | 2/2007 | Gleason et al. | |
| 2011/0104848 A1* | 5/2011 | Haas | C23C 16/24 438/57 |
| 2012/0289078 A1* | 11/2012 | Narwankar | C23C 16/44 439/485 |
| 2012/0315405 A1* | 12/2012 | Landry | C23C 16/24 427/587 |
| 2013/0048987 A1* | 2/2013 | Chatterjee | H01L 21/0245 257/52 |
| 2013/0065401 A1* | 3/2013 | Chatterjee | C23C 16/30 438/758 |
| 2013/0337615 A1* | 12/2013 | Xu | H01L 21/02112 438/125 |
| 2014/0113084 A1* | 4/2014 | Nguyen | C23C 16/44 427/585 |
| 2018/0164245 A1* | 6/2018 | Neikirk | C23C 16/448 |

FOREIGN PATENT DOCUMENTS

| | | | | |
|---|---|---|---|---|
| WO | WO 2013/177541 | * | 11/2013 | ............ H01L 21/60 |
| WO | WO 2014/111743 | * | 7/2014 | ............ H01M 8/10 |
| WO | WO 2018/106886 | * | 6/2018 | ............ H01L 21/02 |

OTHER PUBLICATIONS

Schropp. "Frontiers in HWCVD", Thin Solid Films, 517, 2009, pp. 3415-3419.*
Chen et al., "Multicomponent vapor deposition polymerization of poly(methylmethacrylate) in an axisymmetric vacuum reactor", Polymer, 49, 2008, pp. 1823-1830.*
International Search Report and Written Opinion dated Mar. 29, 2018 received for PCT Application No. PCT/US2017/065056.

* cited by examiner

METHODS FOR DEPOSITING POLYMER LAYER FOR SENSOR APPLICATIONS VIA HOT WIRE CHEMICAL VAPOR DEPOSITION

CROSS-REFERENCE TO RELATED APPLICATIONS

This application claims the benefit of U.S. Provisional Patent Application No. 62/432,357, filed with the United States Patent Office on Dec. 9, 2016, which is herein incorporated by reference in its entirety.

FIELD

Embodiments of the present disclosure generally relate to methods for depositing polymer layers for sensor applications via hot wire chemical vapor deposition (HWCVD).

BACKGROUND

Polymer layers are sometimes utilized in chip based sensor applications. Typically, such polymer layers are formed using wet processes (e.g. spin-coating, meniscus coating, etc.) and dry processes (e.g. plasma enhanced CVD, PE-CVD). However, the inventors have observed that, for some applications, wet processes do not provide sufficient uniformity and process control at low thicknesses (e.g. below 100 nm) and dry processes do not provide sufficient retention of chemical functionality for certain sensor applications.

Therefore, the inventors have provided improved methods for depositing polymer layers for sensor applications via hot wire chemical vapor deposition (HWCVD).

SUMMARY

Methods for depositing a polymer layer are provided herein. In some embodiments, a method of depositing a polymer layer includes: providing a substrate, having a sensor structure disposed on the substrate, to a substrate support within a hot wire chemical vapor deposition (HWCVD) chamber; providing a process gas including an initiator gas and a monomer gas and a carrier gas to the HWCVD chamber; heating a plurality of filaments disposed in the HWCVD chamber to a first temperature sufficient to activate the initiator gas without decomposing the monomer gas; and exposing the substrate and/or sensor structure disposed on the substrate to initiator radicals from the activated initiator gas and to the monomer gas to deposit a polymer layer atop the sensor structure.

In some embodiments, a substrate includes: an ion sensitive field effect transistor sensor structure atop the substrate; and a polymer layer atop the ion sensitive field effect transistor sensor structure having a thickness of less than about 100 nm and a thickness deviation of less than about 5 percent across the substrate.

In some embodiments, a method of depositing a polymer layer or copolymer layer includes: heating a substrate, a sensor structure disposed on the substrate, and a process gas including an initiator gas, a monomer gas, and a carrier gas within a hot wire chemical vapor deposition (HWCVD) chamber, wherein the heating is to a temperature sufficient to form initiator radicals without decomposing the monomer gas; and contacting the substrate and/or sensor structure, the initiator radicals, and the monomer gas to form a polymer layer or copolymer layer atop the sensor structure. In embodiments, the polymer layer or copolymer layer has a thickness of about 1 nm to about 100 nm. In embodiments, the thickness of the polymer layer or copolymer layer has a thickness deviation of less than about 5 percent across the substrate.

In some embodiments, the disclosure may be embodied in a computer readable medium having instructions stored thereon that, when executed, cause a method to be performed in a process chamber, the method includes any of the embodiments disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. The appended drawings illustrate only typical embodiments of the disclosure and are therefore not to be considered limiting of the scope, for the disclosure may admit to other equally effective embodiments.

Figure 1:
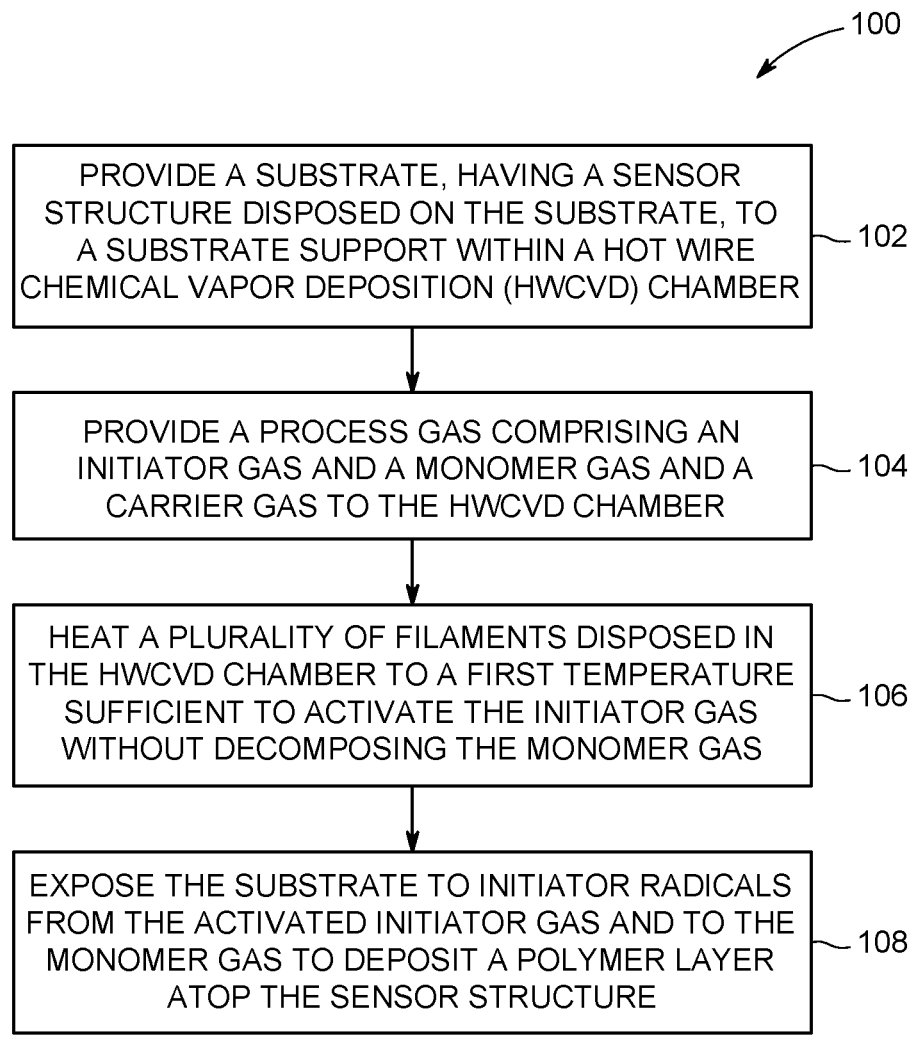
FIG. 1 depicts a flow chart for a method of depositing a polymer layer in accordance with one or more embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure provide hot wire chemical vapor deposition (HWCVD) processing techniques useful for depositing a polymer layer such as a copolymer film for sensor applications. Embodiments of the present disclosure advantageously provide methods of depositing or forming a polymer layer such as copolymer and copolymer film for sensor applications having improved thickness control, uniformity, and chemical functionality as compared to wet processes (e.g. spin-coating, meniscus coating, etc.) and dry processes (e.g. plasma enhanced CVD, PE-CVD) which are currently used to produce similar films. Furthermore, embodiments of the present disclosure advantageously utilize hot wire chemical vapor deposition (HWCVD) to form polymer layers having low thickness (e.g. less than 100 nm) and improved thickness uniformity (e.g. thickness deviation of less than about 5 percent across a substrate). Non-limiting examples of suitable chip-based chemical and biological sensing applications enabled by the present disclosure include pH detection, phosphate detection, and aqueous ion-based chemical detection. In one exemplary application, embodiments of the present disclosure may be used to deposit a polymer layer such as a copolymer onto an ion sensitive field effect transistor (ISFET).

Figure 2:
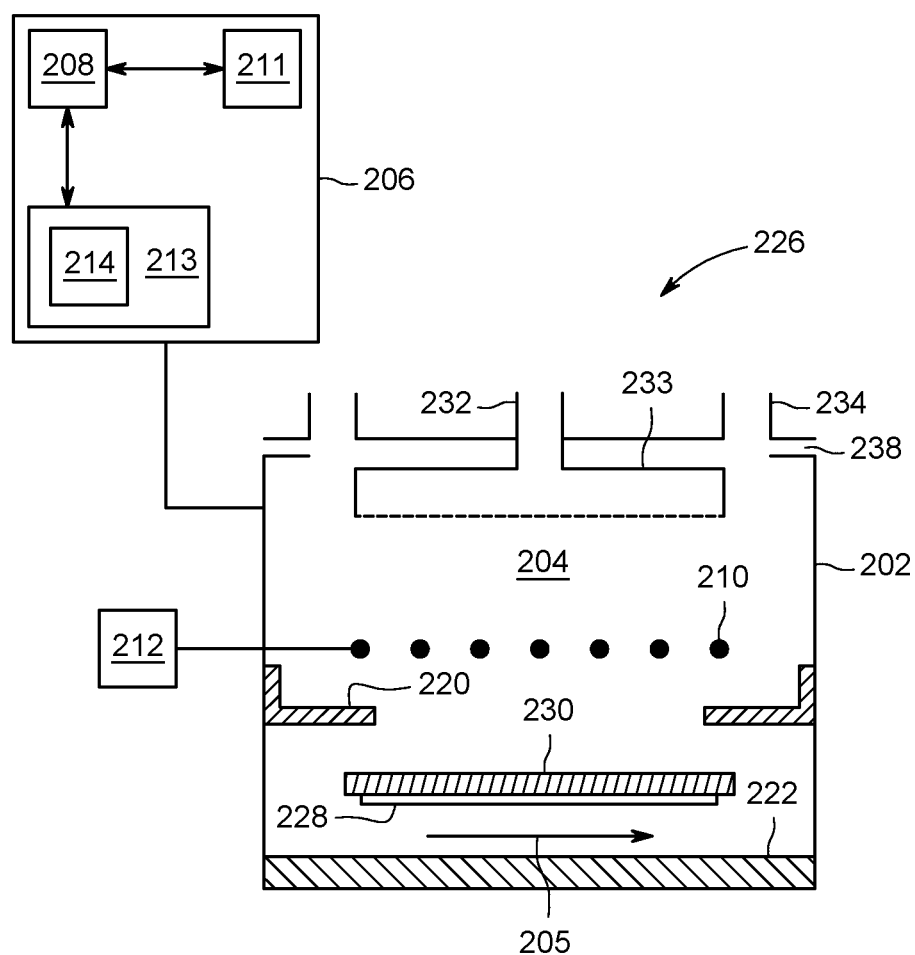
FIG. 2 depicts a schematic side view of a HWCVD process chamber in accordance with one or more embodiments of the present disclosure.

FIG. 1 depicts a flow chart for a method 100 of depositing a polymer layer in a hot wire chemical vapor deposition (HWCVD) process chamber. FIG. 3 depicts the stages of depositing a polymer layer in accordance with some embodiments of the present disclosure. FIG. 2 depicts a schematic side view of an illustrative HWCVD processing system used to perform the method of FIG. 1 in accordance with some embodiments of the present disclosure.

Figure 3A:
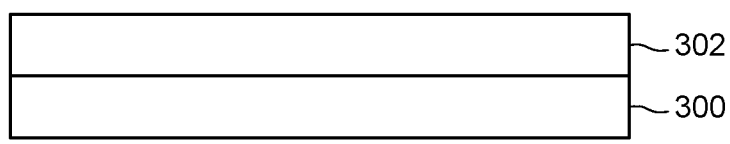
FIG. 3A-3B depicts the stages of depositing a polymer layer in accordance with some embodiments of the present disclosure.

The method 100 begins at 102, and as depicted in FIG. 3A, by providing a substrate 300 having a sensor structure 302 disposed on the substrate 300 to a substrate support within a hot wire chemical vapor deposition (HWCVD) chamber.

The substrate 300 may be any suitable substrate such as a silicon substrate, a III-V compound substrate, a silicon germanium (SiGe) substrate, an epi-substrate, a silicon-on-insulator (SOI) substrate, or the like. In some embodiments, the substrate 300 may be a semiconductor wafer (e.g., a 200 mm, 300 mm, or the like silicon wafer). In some embodiments, the substrate 300 may include additional semiconductor manufacturing process layers, such as dielectric layers, metal layers, and the like. In some embodiments, the substrate 300 may be a partially fabricated semiconductor device such as logic, DRAM, or a flash memory device. In some embodiments, features, such as trenches, vias, or the like, may be formed in one or more layers of the substrate 300.

In some embodiments, the sensor structure 302 disposed on the substrate 300 is a chemical field effect transistor (ChemFET), such as an ion sensitive field effect transistor (ISFET). An ISFET is an impedance transformation device that operates in a manner similar to that of a metal-oxide semiconductor field effect transistor (MOSFET), and is particularly configured to selectively measure ion activity in a solution (e.g., hydrogen ions in a solution). Other exemplary sensor structures formed on the substrate 300 can be a field-effect transistor-based biosensor (BioFET), or enzyme field effect transistor (ENFET). In some embodiments, suitable sensor structures include chip-based chemical and biological sensors suitable for pH detection, phosphate detection, aqueous ion-based chemical detection, and the like.

Next at 104, a process gas including an initiator gas and a monomer gas (or monomer vapor as described below) and a carrier gas is provided to the (HWCVD) chamber. In some embodiments, the process gas consists of, or consists essentially of, the initiator gas, the monomer gas, and the carrier gas. The carrier gas is an inert gas (i.e. a gas that will not react with the initiator gas or the monomer gas) such as argon, nitrogen, helium, or the like. An initiator precursor liquid and a monomer precursor liquid may be stored in ampoules coupled to the HWCVD process chamber. The initiator precursor liquid and the monomer precursors liquid are heated to form a vapor which is then fed to the HWCVD process chamber via a gas inlet 232 coupled to a showerhead 233 as shown in FIG. 2. In some embodiments, monomer precursors and constituents thereof (as described below) are vaporized to form gaseous vapor and subsequently mixed together as gaseous vapor mixture before entering the chamber to promote compositional uniformity. In embodiments, initiator gas and one or more monomer vapors are fed into the HWCVD process chamber separately to prevent, for example, unintentional polymerization or gas phase reaction upstream the process chamber. In some embodiments, the ratio of the flow rate of the initiator gas to the monomer gas is about 0.1:1 to about 1:1.

In embodiments, the initiator gas is a gas that is amenable to thermal decomposition to yield radicals. Non-limiting examples of suitable initiator gases include: di-tert-butyl peroxide (TBPO), di-tert-amyl peroxide (TAPO), triethylamine (TEA), tert-butyl peroxybenzoate, perfluorooctane sulfonyl fluoride, perfluorobutane sulfonyl fluoride, and combinations thereof. In embodiments, the initiator gas is amenable to thermal decomposition at a temperature of about 150 degrees Celsius to about 400 degrees Celsius to yield radicals. In embodiments, the initiator gas is preselected to have a chemistry amenable to thermal decomposition to yield radicals at a temperature below the temperature at which the monomer species (of the related reaction) degrades. In embodiments, the initiator gas is preselected to remain stable at room temperature.

In embodiments, the monomer gas is a monomer vapor in gaseous form including one or more monomer constituents in an amount sufficient to form polymer or copolymer such as copolymer film atop the sensor component. In some embodiments, the monomer gas may include a mixture of a hydrophilic monomer, a crosslinker, and a functional monomer. In some embodiments, the monomer gas may include a mixture of a hydrophilic monomer constituent, a functional monomer constituent, and optionally a crosslinker. In some embodiments, the monomer gas consists of, or consists essentially of, a hydrophilic monomer, a crosslinker, and a functional monomer in accordance with the present disclosure.

In embodiments, the hydrophilic monomer is a monomer containing a polymerizable carbon-carbon double bond and a hydrophilic pendant group. Non-limiting examples of suitable hydrophilic monomers include, but are not limited to: hydroxyethyl methacrylate; N-iso-propylacrylamide; N,N-dimethylacrylamide, methacrylic acid, and combinations thereof. In embodiments, a mixture of hydrophilic monomers constituents is suitable for use in accordance with the present disclosure. In embodiments, non-limiting examples of additional suitable hydrophilic monomers include those described in U.S. Pat. No. 9,777,094 entitled Water-soluble, hydrophobically associating copolymers having novel hydrophobically associating monomers to Bittner, et al.

In embodiments, hydrophilic monomer constituent may be included in a vapor admixture in an amount sufficient to promote the formation of hydrophilic polymer or copolymer. For example, hydrophilic monomer may be added in an amount sufficient to form about 60 mol-% to about 99 mol-% of a copolymer such as a copolymer film in accordance with the present disclosure.

In embodiments, one or more crosslinker constituent(s) may be included in a vapor admixture in an amount sufficient to prevent dissolution of the polymer or copolymer when contacted with solution. In embodiments, the crosslinker is a monomer having more than one polymerizable carbon-carbon double bond. Non-limiting examples of suitable crosslinkers include, but are not limited to: ethyleneglycol dimethacrylate; ethylene glycol diacrylate; butanediol diacrylate; hexanediol diacrylate, and combinations thereof. In embodiments, suitable crosslinker includes crosslinker(s) described in U.S. Pat. No. 9,073,040 entitled Water-absorbent polymer particles to Dobrawa, et al. In some embodiments, a mixture of crosslinker may be used in accordance with the present disclosure.

In some embodiments, the addition of crosslinker is optional. In embodiments, crosslinker is added in an amount sufficient to form about 0.01 mol-% to about 20 mol-% of a copolymer such as a copolymer film in accordance with the present disclosure.

In embodiments, functional monomer may be included in an amount sufficient to provide the polymer or copolymer with a sensing functionality. For example, functional monomer may be added in an amount sufficient to provide the polymer or copolymer with one or more chemical or one or more moieties capable of reacting with specificity with one or more analytes-of-interest.

In embodiments, functional monomer constituent may be added in an amount sufficient to form about 1 mol-% to about 20 mol-% of a copolymer such as a copolymer film in accordance with the present disclosure.

In embodiments, the functional monomer is a monomer containing a polymerizable carbon-carbon double bond and a moiety with chemical or biological functionality. In some embodiments, suitable functional monomers include monomers containing pendant functional groups such as functional group(s) suitable for inclusion in a side chain of a polymer or copolymer and capable of readily bonding to a binding partner. For example, the group in the side chain may be one which readily undergoes (or can be readily made to undergo via simple activation), a coupling reaction with a binding partner to covalently bond the binding partner to the polymer side chain.

In some embodiments, the functional monomer may provide a suitable surface for subsequently chemically attaching a predetermined sensing functionality. Non-limiting examples of sensing functionality include a chemical or moiety that reacts with specificity with one or more analytes-of-interest. For examples, sensing functionalities include the ability to react with or covalently bond with crown ethers, enzymes, antibodies, and proteins suitable for interacting with one or more analytes-of-interest. One none limiting examples is where a functional monomer contains a functional unit such as an amine functional monomer (like 4-aminostyrene) suitable for attachment to an antibody.

Non-limiting examples of suitable groups for inclusion in the functional monomer which undergo reaction with binding partners and which can be readily activated for reaction with binding partners include amino, carboxylic acids, activated carboxylic acids (such as succinimidyl esters, esters, acid chlorides), halides, activated hydroxides (e.g. alkoxides, tosylates, brosylates, mesylates and the like), hydroxyls, thiols, activated thiols (i.e. the thio equivalent of the activated hydroxides), carbonates, maleimides and epoxides.

In some embodiment, the pendant functional groups on the functional monomer may be charged or will contain functionalities capable of readily carrying charge, e.g. amino, phosphate, sulphonic acid or carboxylic acid groups.

Non-limiting examples of suitable functional monomers include, but are not limited to: glycidyl methacrylate; methacrylic acid; 4-aminostyrene. In some embodiments, the functional monomer provides a predetermined sensing functionality.

In embodiments, a mixture of functional monomers may be used in accordance with the present disclosure, for example to allow post-functionalization with multiple sensing functionalities.

Other suitable monomers admixtures for use in accordance with the present disclosure include divinyl benzene as a crosslinker, n-hexyl acrylate in an amount sufficient to modify film hydrophilicity/swellability, and ethylhexyl acrylate.

In embodiments, where monomers polymerize to form a copolymer, the amount of all monomer constituents in the copolymer is 100% by weight. In embodiments, the polymer layer is a copolymer layer such as a copolymer film layer, wherein the copolymer includes one or more hydrophilic monomer constituents, functional monomer constituents, and optionally a crosslinker. In embodiments, the polymer or copolymer composition may be a function of the sensing mechanism, sensitivity, dynamic range, coupling efficiency (via sensing moiety and functional monomer), in accordance with the methods and apparatus of the present disclosure. The inventors have found that polymer or copolymer compositions of the present disclosure including a high functional monomer content may improve sensitivity, and increased crosslinker may improve mechanical stability.

In embodiments, polymer or copolymer is deposited on the top surface of the sensor structure at a deposition rate of 5-50 nm/min.

The partial pressure of the monomer vapor introduced to the HWCVD process chamber is maintained below the saturation pressure of the monomer vapor at the substrate surface temperature to prevent liquid condensation on the substrate 300. In some embodiments, the ratio of partial pressure of the monomer vapor to the saturated pressure of the monomer vapor allows about 1 to about 3 monolayers of the monomer to form on the substrate 300. In some embodiments the ratio of partial pressure of the monomer vapor to the saturated pressure of the monomer vapor to prevent liquid condensation on the substrate is about 0.01 to 0.8.

The monomer vapor introduced to the HWCVD may have a high enough vapor pressure to achieve a reasonable and steady flow rate into the process chamber. For example, suitable monomer precursor gases have a vapor pressure of about 0.005 Torr to about 2 Torr. The inventors have observed that monomer precursor gases having a vapor pressure of less than about 0.005 Torr are difficult to deliver to the HWCVD process chamber while monomer precursor gases having a vapor pressure of greater than about 2 Torr are difficult to condense onto the surface of the substrate 300.

Next at 106, a plurality of filaments disposed in the HWCVD chamber is heating to a first temperature that is sufficient to activate the initiator gas without decomposing the monomer gas. The thermal decomposition of the initiator gas on the heated plurality of filaments provides initiator radicals while monomer molecules physically adsorb onto the surface of the substrate 300. In some embodiments, the plurality of filaments may be heated to a first temperature of about 170 to about 600 degrees Celsius. In some embodiments, the plurality of filaments may be heated to a first temperature of about 150 degrees Celsius to about 600 degrees Celsius. In some embodiments, the plurality of filaments may be heated to a first temperature of about 150 to about 400 degrees Celsius.

Figure 3B:
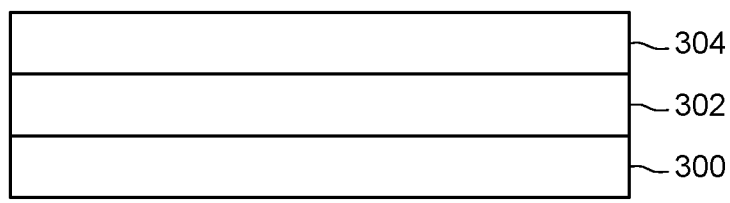

Next at 108, and as depicted in FIG. 3B, the substrate 300 is exposed to the initiator radicals from the activated initiator gas and to the monomer gas to deposit a polymer layer 304 atop the sensor structure 302. The initiator radicals formed at 106 above react with the monomer molecules on the surface of the sensor structure 302 to form the polymer layer 304.

In some embodiments, the pressure in the HWCVD process chamber is about 0.1 to about 10 Torr. In some embodiments, a temperature of the substrate 300 is about −20 degrees Celsius to about 100 degrees Celsius during the method 100. In some embodiments, a temperature of the substrate 300 is about 0 degrees Celsius to about 50 degrees Celsius during the method 100. The substrate 300 is disposed atop a substrate support pedestal having heating and cooling channels to control the temperature of the substrate 300. In some embodiments, monomers with extremely low vapor pressures may require elevated temperatures to prevent condensation at typical partial pressures, which range from 10 mTorr to a 5 Torr. Similarly, monomers with extremely high vapor pressures may require very low temperatures to achieve sufficient surface adsorption in the same pressure range.

In some embodiments, the polymer layer 304 has a thickness of less than about 100 nm. In some embodiments, the polymer layer 304 has a thickness of about 1 nm to about 100 nm. In some embodiments, the polymer layer 304 has a constant composition through the thickness of the polymer layer 304. In some embodiments, the polymer layer 304 can have varying composition (i.e. a gradient) across the layer thickness achieved by varying the flow rate of the monomers (i.e. the hydrophilic monomer, the crosslinker, and the functional monomer).

In some embodiments, prior to beginning the method 100, the substrate 300 disposed in the HWCVD process chamber is exposed to a treatment process (e.g., the substrate and or sensing structure is exposed to an adhesion chemistry) to improve adhesion of the polymer layer 304 to the underlying material (e.g. to prevent delamination of the polymer layer 304 from the underlying substrate 300 or sensor structure 302). For example, suitable treatment processes may include chemical pretreatment such as contacting a native oxide or SiNx substrate with trichlorovinyl silane surface treatment. For example a native oxide or nitride substrate surface may be exposed to TCVS vapor to form SAM of vinyl functionality.

In embodiments, pretreatment of the top surface of the sensor structure may include a "graft from" methodology where a polymer layer is attached by growing the polymer layer from the underlying substrate or top surface. For example, HWCVD polymer deposition may be a suitable pretreatment where a vinyl surface modified Si substrate is surface activated by a primary radical, such that polymer growth arises from the top surface of the substrate.

Other examples of pretreatment may include a graft to methodology. In embodiments, trimethoxysilylpropyl acrylate (TMSPA) may be used as an adhesion promoting comonomer. In embodiments, adhesion promotion is performed by first growing a film, and then chemically bond the film to the underlying substrate.

In some embodiments, a method of depositing a polymer layer, includes: heating a substrate, a sensor structure disposed on the substrate, and a process gas including an initiator gas, a monomer gas, and a carrier gas within a hot wire chemical vapor deposition (HWCVD) chamber, wherein the heating is to a temperature sufficient to form initiator radicals without decomposing the monomer gas; and contacting the substrate, the initiator radicals, and the monomer gas to form a polymer layer atop the sensor structure. In embodiments, the polymer layer or copolymer film has a thickness of about 1 nm to about 100 nm. In embodiments, the thickness of the polymer layer or copolymer film has a thickness deviation of less than about 5 percent across the substrate. In some embodiments, heating further comprises controlling the heat of the process chamber environment at and immediately adjacent (such as within 1-5 cm) to the one or more filaments to a temperature sufficient to form initiator radicals without decomposing the monomer gas. In some embodiments, heating further includes controlling the temperature of the substrate and sensor structure to a temperature suitable to promote adsorption of the monomers and radicals, and the formation of polymer or copolymer as described herein. In some embodiments, controlling the temperature of the substrate and sensor structure to a temperature suitable to promote adsorption of the monomers and radicals, and the formation of polymer or copolymer includes cooling the substrate and sensor structure to a temperature below the temperature of the filament(s).

In embodiments, a polymer layer 304 may be deposited atop a sensor structure 302 formed atop a substrate 300 via method 100 to provide improved thickness control, uniformity, and chemical functionality as compared to polymer layers for sensor functions formed via wet processes or other dry processes. For example, a polymer layer 304 deposited atop a sensor structure 302 via wet processes or other dry processes fail to form polymer layers having low thickness (e.g. less than 100 nm or about 1 nm to about 100 nm) with improved thickness uniformity (e.g. thickness deviation of less than about 5 percent across a substrate 300). The wet processes (e.g. spin coating) can only form polymer layers having a single composition throughout the thickness of the polymer layer 304. However, the polymer layer 304 formed via method 100 can have a predetermined sensing functionality at a surface of the polymer layer 304 while the bulk of the polymer layer 304 below the surface provides predetermined mechanical properties such as toughness, hardness, or dielectric constant. For example, the polymer layer 304 formed via method 100 can have multilayer polymer layer 304 or a changing composition throughout the thickness of the polymer layer 304.

FIG. 2 depicts a schematic side view of an HWCVD process chamber 226 (i.e. process chamber 226) suitable for use in accordance with embodiments of the present disclosure. The process chamber 226 generally comprises a chamber body 202 having an internal processing volume 204. A plurality of filaments are disposed within the chamber body 202 (e.g., within the internal processing volume 204). The plurality of filaments 210 may also be a single wire routed back and forth across the internal processing volume 204. The plurality of filaments 210 comprise a HWCVD source. The filaments 210 are typically made of tungsten, although tantalum or iridium may also be used. The filaments 210 is clamped in place by support structures (not shown) to keep the filaments taut when heated to high temperature, and to provide electrical contact to the wire. A power supply 212 is coupled to the filaments 210 to provide current to heat the filaments 210. A substrate 230 may be positioned under the HWCVD source (e.g., the filaments 210), for example, on a substrate support 228. The substrate support 228 may be stationary for static deposition, or may move (as shown by arrow 205) for dynamic deposition as the substrate 230 passes under the HWCVD source.

The chamber body 202 further includes one or more gas inlets (one gas inlet 232 shown) to provide one or more process gases and one or more outlets (two outlets 234 shown) to a vacuum pump to maintain a suitable operating pressure within the process chamber 226 and to remove excess process gases and/or process byproducts. The gas inlet 232 may feed into a shower head 233 (as shown), or other suitable gas distribution element, to distribute the gas uniformly, or as non-uniformly, over the filaments 210.

In some embodiments, one or more shields 220 may be provided to minimize unwanted deposition on interior surfaces of the chamber body 202. Alternatively or in combination, one or more chamber liners 222 can be used to make cleaning easier. The use of shields, and liners, may preclude or reduce the use of undesirable cleaning gases, such as the greenhouse gas $NF_3$. The shields 220 and chamber liners 222 generally protect the interior surfaces of the chamber body from undesirably collecting deposited materials due to the process gases flowing in the chamber. The shields 220 and chamber liners 222 may be removable, replaceable, and/or cleanable. The shields 220 and chamber liners 222 may be configured to cover every area of the chamber body that could become coated, including but not limited to, around the filaments 210 and on all or substantially all walls of the coating compartment. Typically, the shields 220 and chamber liners 222 may be fabricated from aluminum (Al) and may have a roughened surface to enhance adhesion of deposited materials (to prevent flaking off of deposited material). The shields 220 and chamber liners 222 may be mounted in predetermined areas of the process chamber, such as around the HWCVD sources, in any suitable manner. In some embodiments, the source, shields, and liners may be removed for maintenance and cleaning by opening an upper portion of the deposition chamber. For example, in some embodiments, the a lid, or ceiling, of the deposition chamber may be coupled to the body of the deposition chamber along a flange 238 that supports the lid and provides a surface to secure the lid to the body of the deposition chamber.

A controller 206 may be coupled to various components of the process chamber 226 to control the operation thereof. Although schematically shown coupled to the process chamber 226, the controller may be operably connected to any component that may be controlled by the controller, such as the power supply 212, a gas supply (not shown) coupled to the gas inlet 232, a vacuum pump and or throttle valve (not shown) coupled to the outlet 234, the substrate support 228, and the like, in order to control the HWCVD deposition process in accordance with the methods disclosed herein. The controller 206 generally comprises a central processing unit (CPU) 208, a memory 213, and support circuits 211 for the CPU 208. The controller 206 may control the process chamber 226 directly, or via other computers or controllers (not shown) associated with particular support system components. The controller 206 may be any form of general-purpose computer processor that can be used in an industrial setting for controlling various chambers and sub-processors. The memory, or computer-readable medium, 213 of the CPU 208 may be one or more of readily available memory such as random access memory (RAM), read only memory (ROM), floppy disk, hard disk, flash, or any other form of digital storage, local or remote. The support circuits 211 are coupled to the CPU 208 for supporting the processor in a conventional manner. These circuits include cache, power supplies, clock circuits, input/output circuitry and subsystems, and the like. Inventive methods as described herein may be stored in the memory 213 as software routine 214 that may be executed or invoked to turn the controller into a specific purpose controller to control the operation of the process chamber 226 in the manner described herein. The software routine may also be stored and/or executed by a second CPU (not shown) that is remotely located from the hardware being controlled by the CPU 208.

While the foregoing is directed to embodiments of the present disclosure, other and further embodiments of the disclosure may be devised without departing from the basic scope thereof.

The invention claimed is:

1. A method of depositing a polymer layer, comprising:
heating a substrate, a field-effect transistor sensor structure disposed on the substrate, and a process gas comprising an initiator gas, a monomer gas, and a carrier gas within a hot wire chemical vapor deposition (HWCVD) chamber, wherein the heating is to a temperature sufficient to form initiator radicals without decomposing the monomer gas; and
contacting the field-effect transistor sensor structure, the initiator radicals, and the monomer gas to form a polymer layer atop the field-effect transistor sensor structure, wherein the polymer layer has a thickness of about 1 nm to about 100 nm, and wherein the thickness has a thickness deviation of less than about 5 percent across the substrate, wherein the field-effect transistor sensor structure is one of a chemical field effect transistor, an ion sensitive field effect transistor, a field-effect transistor-based biosensor, an enzyme field effect transistor, a chip-based chemical sensor, or a chip-based biosensor.

2. The method of claim 1, further comprising cooling the substrate and field-effect transistor sensor structure.

3. The method of claim 1, wherein the polymer layer is a copolymer layer, and wherein the copolymer comprises one or more hydrophilic monomer constituents, functional monomer constituents, and optionally a crosslinker.

4. A method of depositing a polymer layer, comprising:
providing a substrate, having a field-effect transistor sensor structure disposed on the substrate, to a substrate support within a hot wire chemical vapor deposition (HWCVD) chamber, wherein the field-effect transistor sensor structure is one of a chemical field effect transistor, an ion sensitive field effect transistor, a field-effect transistor-based biosensor, an enzyme field effect transistor, a chip-based chemical sensor, or a chip-based biosensor;
providing a process gas comprising an initiator gas and a monomer gas and a carrier gas to the HWCVD chamber;
heating a plurality of filaments disposed in the HWCVD chamber to a first temperature sufficient to activate the initiator gas without decomposing the monomer gas; and
exposing the substrate to initiator radicals from the activated initiator gas and to the monomer gas to deposit a polymer layer atop the field-effect transistor sensor structure, wherein the polymer layer has a thickness of about 1 nm to about 100 nm, and wherein the thickness has a thickness deviation of less than about 5 percent across the substrate.

5. The method of claim 4, wherein the plurality of filaments are heated to a temperature of about 150 to about 600 degrees Celsius.

6. The method of claim 4, wherein a temperature of the substrate is about −20 degrees Celsius to about 100 degrees Celsius.

7. The method of claim 4, further comprising:
prior to flowing the process gas, treating the substrate with an adhesion chemistry to prevent delamination of the polymer layer from the field-effect transistor sensor structure.

8. The method of claim 4, wherein the carrier gas is argon, nitrogen, or helium.

9. The method of claim 4, wherein the initiator gas is di-tert-butyl peroxide (TBPO), di-tert-amyl peroxide (TAPO), triethylamine (TEA), tert-butyl peroxybenzoate, perfluorooctane sulfonyl fluoride, or perfluorobutane sulfonyl fluoride.

10. The method of claim 4, wherein the monomer gas comprises a mixture of a hydrophilic monomer, a crosslinker and a functional monomer.

11. The method of claim 10, wherein the hydrophilic monomer contains a polymerizable carbon-carbon double bond and a hydrophilic pendant group.

12. The method of claim 10, wherein the hydrophilic monomer is hydroxyethyl methacrylate, N-iso-propylacrylamide, N,N-dimethylacrylamide, or methacrylic acid.

13. The method of claim 10, wherein the crosslinker contains more than one polymerizable carbon-carbon double bond, or wherein the crosslinker is ethyleneglycol dimethacrylate, ethylene glycol diacrylate, butanediol diacrylate, or hexanediol diacrylate.

14. The method of claim 10, wherein the functional monomer contains a polymerizable carbon-carbon double bond and a moiety with chemical or biological functionality.

15. The method of claim 10, wherein the functional monomer is glycidyl methacrylate, methacrylic acid, or 4-aminostyrene.

16. The method of claim 4, wherein a ratio of a flow rate of the initiator gas to the monomer gas is about 0.1:1 to about 1:1, and wherein a pressure in the HWCVD chamber is about 0.1 to about 10 Torr.

17. A method of depositing a polymer layer, comprising:
heating a substrate, a sensor structure disposed on the substrate, and a process gas comprising an initiator gas, a monomer gas, and a carrier gas within a hot wire chemical vapor deposition (HWCVD) chamber, wherein the heating is to a temperature sufficient to form initiator radicals without decomposing the monomer gas; and
contacting the sensor structure, the initiator radicals, and the monomer gas to form a polymer layer atop the sensor structure, wherein the sensor structure is one of a chemical field effect transistor, an ion sensitive field effect transistor, a field-effect transistor-based biosensor, an enzyme field effect transistor, a chip-based chemical sensor, or a chip-based biosensor.

18. The method of depositing a polymer layer of claim 17, wherein the polymer layer has a thickness of about 1 nm to about 100 nm, and wherein the thickness has a thickness deviation of less than about 5 percent across the substrate.

* * * * *